United States Patent [19]
Dever

[11] 4,158,150
[45] Jun. 12, 1979

[54] SOLID STATE RELAY WITH ZERO CROSSOVER FEATURE

[75] Inventor: Thomas R. Dever, Princeton, Ind.

[73] Assignee: AMF Incorporated, White Plains, N.Y.

[21] Appl. No.: 869,073

[22] Filed: Jan. 10, 1978

[51] Int. Cl.² ............................................. H03K 17/72
[52] U.S. Cl. ........................ 307/252 B; 307/252 UA; 323/18; 323/21
[58] Field of Search ............ 307/252 B, 252 J, 252 N, 307/252 VA, 311; 323/18, 21

[56] References Cited

U.S. PATENT DOCUMENTS

| | | | |
|---|---|---|---|
| 3,935,482 | 1/1976 | Fox, Jr. et al. | 307/252 UA |
| 4,038,584 | 7/1977 | Tarchalski et al. | 307/252 B |

*Primary Examiner*—John Zazworsky
*Attorney, Agent, or Firm*—George W. Price; John H. Gallagher

[57] ABSTRACT

A solid state relay in which the control circuit for controlling a bidirectional conduction device (triac) includes a silicon controlled rectifier (SCR) and a photo transistor that is responsive to a light coupled control signal. Both the SCR and the photo transistor are coupled in parallel between the d.c. terminals of a full wave rectifier. The base of the photo transistor and the gate of the SCR are coupled to the collector of a transistor that is connected in an common emitter configuration between the d.c. terminals of the rectifier. The last-named transistor has its base connected to the collector of the photo transistor. The last-named transistor is a zero voltage crossover detector and conducts only when the photo transistor is nonconducting. The photo transistor and SCR may conduct only when the crossover detector transistor is nonconducting.

12 Claims, 1 Drawing Figure

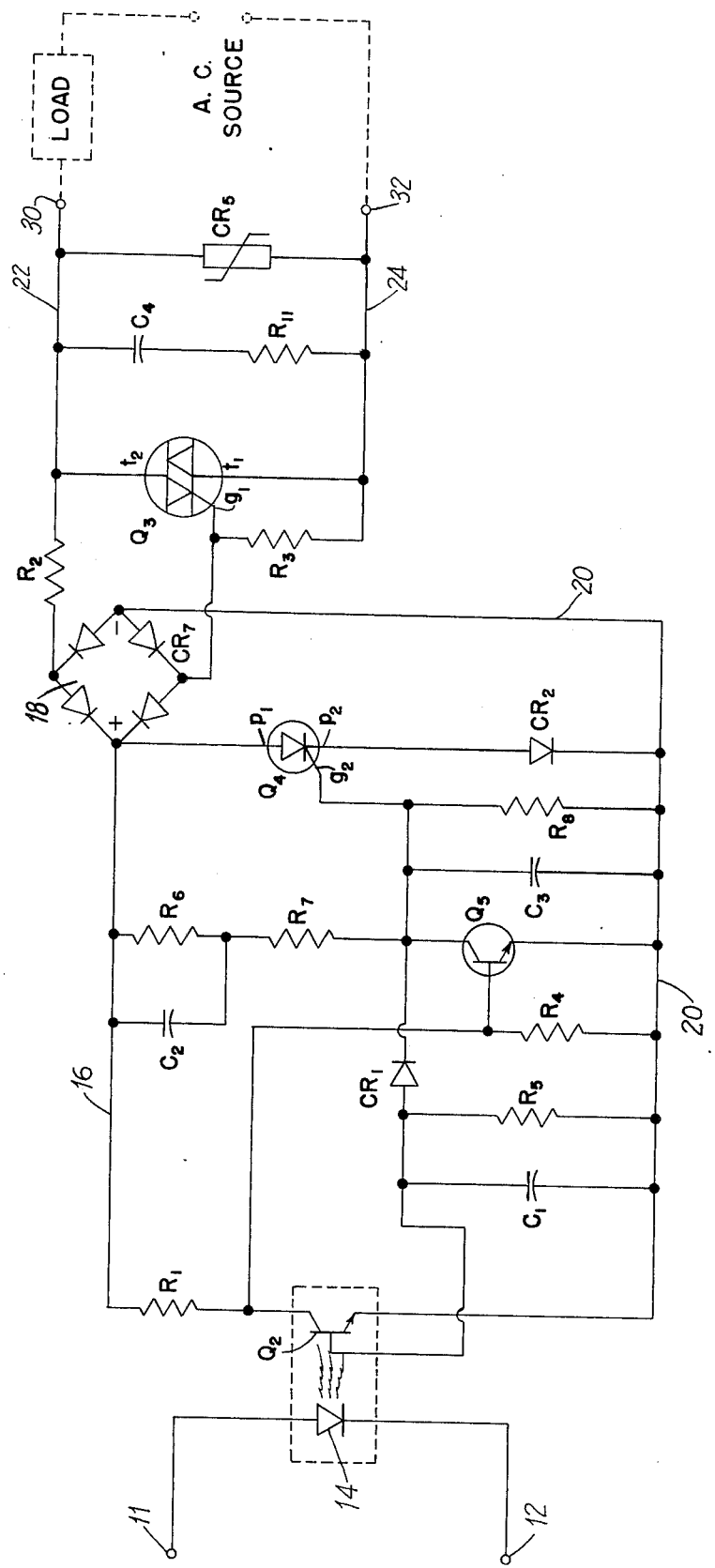

SOLID STATE RELAY WITH ZERO CROSSOVER FEATURE

BACKGROUND OF THE INVENTION

Many solid state relay circuits are commercially available and a great many more circuits have been disclosed in the patent literature and elsewhere. Typically, these circuits operate in response to an input control signal of low magnitude to cause some bidirectional conduction device such as a triac to conduct to close a circuit that is connectable to a load and a higher a.c. voltage source. To minimize the creation of transients during switching of the solid state circuits it is common to include what has become known as zero crossover detectors to allow the triacs to be turned on only when the higher a.c. voltage source is at a very low magnitude near zero.

The present invention is an improved solid state relay circuit having the zero crossover switching feature. The circuit is less complex than some prior art circuits and provides improved reliability.

BRIEF DESCRIPTION OF THE DRAWINGS

The accompanying drawing is a schematic circuit diagram of a presently preferred embodiment of my invention.

DESCRIPTION OF PREFERRED EMBODIMENT

Referring now in detail to the accompanying circuit diagram, terminals 11 and 12 are input terminals to which input control signals are applied. In the operation of this solid state relay, the load circuit is closed in response to the control signals. Input control signals are applied to light emitting diode (LED) 14 which emits light when a current above a given magnitude is conducted therethrough, as is well understood. Associated with LED 14 is a photo transistor $Q_2$ which is capable of being rendered conductive by light incident on its collector-base junction region, as is well understood. LED 14 and photo transistor $Q_2$ are commercially available as an integral unit. This photo coupler affords electrical isolation at the input. The collector electrode of photo transistor $Q_2$ is connected through resistor $R_1$ and lead 16 to the positive terminal of full wave rectifier 18. The emitter electrode of photo transistor $Q_2$ is connected to lead 20 which is directly connected to the negative terminal of full wave rectifier 18.

One a.c. terminal of rectifier 18 is connected through resistor $R_2$ to the a.c. load conductor 22 and the second a.c. terminal of rectifier 18 is coupled through resistor $R_3$ to the a.c. line conductor 24. A source of a.c. voltage and a load to be switched are connectable to conductors 22 and 24. Terminals 30 and 32 may be considered the output terminals of the solid state relay.

A gated bidirectional conduction device $Q_3$ is connected across conductors 22 and 24. As illustrated, device $Q_{23}$ may be a triac device that has two main conduction electrodes or terminals $t_1$ and $t_2$ and a control or gate electrode $g_1$. The gate electrode $g_1$ is connected to a junction between resistor $R_3$ and the second a.c. terminal of rectifier 18. Alternatively, as is well understood by those skilled in the art, back-to-back silicon controlled rectifiers (SCR) having respective gate electrodes and respective gating means may be used to provide gated bidirectional conduction between conductors 22 and 24.

As will be explained in detail below, silicon controlled rectifier (SCR) $Q_4$ having main electrodes or terminals $P_1$ and $P_2$ and a control or gate electrode $g_2$ is the pilot device whose conduction controls the conduction of triac $Q_3$. As illustrated, the main terminals of SCR $Q_4$ are connected between the positive and negative terminals of full wave rectifier 18. The device provides gated unidirectional current conduction between the d.c. terminals of the rectifier. If desired, a diode $CR_2$ may be connected in the cathode circuit of SCR $Q_4$ to make the device less sensitive in its triggering. Such device may not be required if the SCR characteristics are such that false triggering on low voltage signals is not a problem.

The control circuit that responds to input control signals and renders SCR $Q_4$ and triac $Q_3$ conductive includes the previously described photo transistor $Q_2$, transistor $Q_5$, diode $CR_1$, and other resistive and capacitive circuit components to be described. The base electrode of photo transistor $Q_2$ is coupled to line 20 through the parallel combination of capacitor $C_1$ and resistor $R_5$. This connection serves to make photo transistor $Q_2$ less sensitive to triggering on false and spurious signals and make it more reliably responsive only to light signals coupled from LED 14.

NPN transistor $Q_5$ has its emitter directly connected to lead 20. Its collector is connected to lead 16 through the parallel combination of capacitor $C_2$ and resistor $R_6$ in series with resistor $R_7$. The control or base electrode of transistor $Q_5$ is connected to a junction between resistor $R_1$ and the collector of photo transistor $Q_2$. Stabilizing resistor $R_4$ is connected between the base and emitter of transistor $Q_5$. The collector of transistor $Q_5$ is directly connected to the gate electrode $g_2$ of the pilot SCR $Q_4$, and also is coupled to the base electrode of photo transistor $Q_2$ through diode $CR_1$. Diode $CR_1$ is poled for forward conduction in the direction from the base of photo transistor $Q_2$ to the collector of $Q_5$. As will be described in detail below, common emitter transistor $Q_5$ forms the zero crossover detector of this solid state relay circuit.

Capacitor $C_2$ aids in speeding up the turn on of SCR $Q_4$. Resistor $R_6$ is a current limiter. Resistor $R_7$ serves as a surge damper and current limiter.

Capacitor $C_3$ and resistor $R_8$ are connected in parallel between the gate $g_2$ of SCR $Q_4$ and conductor 20. These components provide proper bias voltages and aid in transient supression for gate $g_2$ of SCR $Q_4$.

The series combination of capacitor $C_4$ and resistor $R_{11}$ shunting triac $Q_3$ provides dv/dt protection for the triac. $CR_5$ is a metal oxide varistor that limits the magnitude of voltage transients across triac $Q_3$.

In the discussion of the operation of the described solid state relay circuit it will be assumed that the control signal applied to input terminals 11 and 12 to turn on triac $Q_3$ is a steady state d.c. signal. In practice, other types and forms of control signals may be used and additional circuitry may be desired in association with LED 14. Because the input circuitry forms no part of the present invention the description has been simplified by showing only the input terminals 11 and 12 to LED 14.

Initially it will be assumed that no control signal is present on input terminals 11 and 12 and that an a.c. voltage is present at the a.c. source. With no control signal present, no d.c. current flows through LED 14 and no light signal is coupled to photo transistor $Q_2$. Because the base electrode of photo transistor $Q_2$ is coupled to its emitter through capacitor $C_1$ and resistor $R_5$, transistor $Q_2$ remains nonconducting. Base drive current now may flow to the base of transistor $Q_5$ from the positive terminal of rectifier 18 and over lead 16 and through resistor $R_1$. Transistor $Q_5$ therefore is rendered conductive each time the full wave rectified voltage on lead 16 exceeds some predetermined magnitude greater than zero. The collector of transistor $Q_5$ is very nearly at the potential of the negative terminal of rectifier 18 each time the transistor conducts, i.e., each half cycle. The conduction of transistor $Q_5$ bypasses gate current away from gate $g_2$ of SCR $Q_4$ and places the gate $g_2$ and cathode of SCR $Q_4$ very nearly at the same potential, thus holding $Q_4$ in a nonconducting state.

When transistor $Q_5$ is in conduction, the cathode of diode $CR_1$ is close to the potential of line 20 so that the diode is properly biased for forward conduction. Consequently, a conduction path exists through diode $CR_1$ and transistor $Q_5$ so that the base and emitter of photo transistor $Q_2$ are at very nearly the same potential and $Q_2$ is held in an effectively nonconducting state.

It thus is apparent that when transistor $Q_5$ begins conducting at some predetermined voltage greater than zero volts it holds both photo transistor $Q_2$ and SCR $Q_4$ in their nonconducting states. Because SCR $Q_4$ is nonconducting there is insufficient gate current applied to gate $g_1$ of triac $Q_3$ to turn the triac on. The triac therefore remains nonconducting and substantially no a.c. load current flows through the load in the a.c. circuit.

Assume now that a control signal is applied to input terminals 11 and 12 and that sufficient current flows through LED 14 to produce a light output that couples to photo transistor $Q_2$. Assume also that the full wave rectified voltage on lead 16 is just beginning to increase from zero volts. At some small value of voltage that is yet insufficient to cause transistor $Q_5$ to conduct, photo transistor $Q_2$ will conduct and will pass current from lead 16, through resistor $R_1$ to lead 20. Base drive current therefore is shunted away from the base of transistor $Q_5$ and that transistor is held in its nonconducting state. Because $Q_5$ is nonconducting, current flows from lead 16 through capacitor $C_2$, resistors $R_6$ and $R_7$ to the gate electrode $g_2$ of SCR $Q_4$ and causes the SCR to conduct. Current now flows from the positive terminal of rectifier 18 through the anode-cathode conduction path of SCR $Q_4$, over lead 20 to the negative terminal of the rectifier and through rectifier diode $CR_7$ to the gate $g_1$ of triac $Q_3$. This current is of sufficient magnitude to cause triac $Q_3$ to begin to conduct. It remains is conduction the remainder of that half cycle of the a.c. source voltage. So long as photo transistor $Q_2$ becomes conductive prior to transistor $Q_5$, $Q_5$ will be held in its nonconductive state for the remainder of the half cycle.

It will be noted that when transistor $Q_5$ is nonconducting its collector electrode is at a high potential. Consequently, diode $CR_1$ blocks the conduction path between the collector of transistor $Q_5$ and the base of photo transistor $Q_2$. This prevents the shunting of SCR $Q_4$ gate current through the base of photo transistor $Q_2$.

Assume now that the control signal is applied to input terminals 11 and 12 at a time when the full wave rectified voltage on lead 16 is at a magnitude greater than some predetermined value, e.g., 15 volts for a maximum voltage of 120 volts on lead 16. Just as before, the control signal will cause LED 14 to conduct and emit a light that is incident on photo transistor $Q_2$. Photo transistor $Q_2$ will not conduct, however, despite the presence of the light signal incident on it because transistor $Q_5$ went into conduction at the above-mentioned lower predetermined voltage and now, together with forward biased diode $CR_1$, is substantially shunting the base-emitter circuit of photo transistor $Q_2$ to hold it in its effectively nonconducting state. As explained earlier, when transistor $Q_5$ is conducting it bypasses gate current away from SCR $Q_4$ so that the SCR and triac $Q_3$ both are held in their nonconducting states.

If the control signal persists until the beginning of the next half cycle of voltage on lead 16, the incident light on photo transistor $Q_2$ will cause transistor $Q_2$ to conduct before transistor $Q_5$ can turn on. As stated above, one photo transistor $Q_2$ conducts it holds transistor $Q_5$ in its nonconducting state to allow gate current to flow to gate $g_2$ of SCR $Q_4$. SCR $Q_4$ turns on to provide sufficient gate current to gate $g_1$ to turn on triac $Q_3$.

It is seen that common emitter transistor $Q_5$ functions as a zero voltage crossover detector. It also is seen that transistor $Q_5$ will not turn on if a control signal causes photo transistor $Q_2$ to turn on within the so called "zero crossover window." This operation is different from other zero crossover detectors that turn on each half cycle of line voltage, irrespective of whether they prevent the pilot device (SCR) from turning on.

It is seen that the improved circuit of this invention is relatively simple for a solid state relay that includes a zero crossover detector, and provides improved immunity to transient signals. Important features of this circuit include the connection through diode $CR_1$ between the base of photo transistor $Q_2$ and the collector of zero crossover detector transistor $Q_5$, and the connection of the base of transistor $Q_5$ to the collector of photo transistor $Q_2$. These connections assure that only one of the transistors can be on at a given time. Therefore, the photo transistor can turn on to activate the solid state relay only when the voltage on lead 16 is below some predetermined low voltage near the zero crossover of the a.c. line voltage. Once the line voltage is above the predetermined value photo transistor $Q_2$ cannot turn on. This is an improvement over prior art circuits in which the photo coupler produces an output signal every time a control signal is applied. These prior art circuits may result in the magnitude of current flow through the photo transistor being several orders of magnitude greater than that handled by the photo transistor in the circuit of this invention.

Because photo transistor $Q_2$ and crossover detector $Q_5$ never can conduct at the same time, and because the first one to conduct holds the other one in a nonconducting state, their turn-on characteristics must be selected relative to each other to assure the turn-on of the desired one of the two at the various possible operating situations within and without the so called "zero crossover window." In this connection, the operating characteristics of LED 14 must be considered. The type of input circuit used with LED 14 may be influenced by the turn on characteristics required of transistors $Q_2$ and $Q_5$. Arrival at the proper design to achieve operation in accordance with this invention is within the capabilty of one of ordinary skill in the art. Listed below is one example of specific circuit components and devices that produces an operable solid state relay.

The use of the diode $CR_1$ prevents false turn-on of photo transistor $Q_2$ by a large positive transient spike that otherwise could be coupled from lead 16 through capacitor $C_2$ and resistors $R_6$ and $R_7$ to the base of $Q_2$. Turn on of $Q_2$ would turn off transistor $Q_5$ and falsely trigger SCR $Q_4$. Diode $CR_1$ blocks such transients and effectively isolates the base of $Q_2$ from them.

The use of diode $CR_1$ between the base of photo transistor $Q_2$ and the collector of transistor $Q_5$ presently is preferred, but some other unidirectional current conduction device could be used in its place. As an example, a transistor could be connected with its collector-emitter conduction path in the same direction as the forward conduction path of diode $CR_1$. The base of the transistor could be coupled to lead 16 through a current dropping resistor or it could be connected directly to its collector.

As mentioned above, the use of an unidirectional conduction device such as diode $CR_1$ effectively isolates the base of photo transistor $Q_2$ from transients that might otherwise be coupled by way of capacitor $C_1$ and resistors $R_6$ and $R_7$. If it could be assured that transistor $Q_5$ was faster acting than the photo transistor, it might be possible to have a direct connection between the base of $Q_2$ and collector of $Q_5$. However, for reliability, the use of diode $CR_1$ presently is preferred.

The improved transient immunity and dv/dt capability results to a great extent from the fact that all the active components in the control circuit ($Q_2$, $Q_4$ and $Q_5$) are tied together and when they all change states they change substantially simultaneously rather than independently and intermittently.

False triggering is minimized by the fact that when the circuit is in its desired OFF condition, conducting transistor $Q_5$ maintains the base-emitter circuit of photo transistor $Q_2$ and the gate-cathode circuit of SCR $Q_4$ both very nearly in short circuit conditions.

Another advantageous feature of the circuit of this invention is that the current flowing through photo transistor $Q_2$ always is at a relatively low value. When photo transistor $Q_2$ first turns on, the voltage level across resistor $R_1$ is low and limits the current through $Q_2$. After SCR $Q_4$ and triac $Q_3$ become conductive, the voltage across resistor $R_1$ cannot exceed the very low on-state voltage across the triac. Therefore, the current through photo transistor $Q_2$ remains low.

Listed below are representative values and types of circuit components that may be used in a solid state relay suitable for use in switching 4 amperes at 120 volts a.c. through a load in response to a d.c. control signal having a magnitude of 5 volts d.c.

$R_1$, $R_6$—270 k ohms
$R_2$—10 ohms
$R_3$—27 ohms
$R_4$, $R_8$—100 k ohms
$R_5$—430 k ohms
$R_7$—12 k ohms
$R_{11}$—15 ohms
$C_1$—150 pf 1,000 volt (Sprague 10TS)
$C_2$—220 pf 1,000 volt (Sprague 10TS)
$C_3$—150 pf (Sprague 10TS)
$C_4$—0.047 uf 600 v. (Paktron FM 1100)
$CR_1$, $CR_2$—1N4007
$CR_5$—V150 LA2 (GE)
$CR_7$—VM 68 (Varo)
$Q_2$—Opto-coupler H11AX717 (GE)
$Q_3$—SC146 DX39 (GE)
$Q_4$—C106 D1X303 (GE)
$Q_5$—SPS 7773K (Motorola)

In its broader aspects, this invention is not limited to the specific embodiment illustrated and described. Various changes and modofications may be made without departng from the inventive principles herein disclosed.

What is claimed is as follows:

1. A control circuit for a solid state relay comprising first and second power conductors for energizing said control circuit, control signal transistor means having collector and emitter electrodes connected between said power conductors, greater said transistor means having control means that includes a base electrode and being operable in response to a control signal being applied to the control means, means for coupling a control signal to said control means of the transistor means, wherein a unidirectional conduction device having main terminals connected between said power conductors and having a gate electrode for controlling current conduction therethrough, zero crossover detector means comprising a transistor having a base electrode and having collector and emitter electrodes coupled between the power conductors, the base electrode of the crossover detector means being coupled to the collector of the control signal transistor means, means for providing a unidirectional conduction path between the base of the control signal transistor means and the collector of the said crossover detector means, and means for coupling the collector electrode of the crossover detector means to the gate electrode of the said unidirectional conduction device.

said crossover detector means being capable of turning on to conduct current only when the control signal transistor means is nonconducting and the voltage on said power conductors is in excess of some predetermined zero crossover value.

2. The combination claimed in claim 1 wherein said control signal transistor means is responsive to a light input control signal, and wherein said means for coupling a control signal to said control means includes means for emitting a light signal that is directed onto said control means.

3. The combination claimed in claim 1 wherein said unidirectional conduction path includes a diode poled for conduction toward the collector of said crossover detector means.

4. The combination claimed in claim 3 wherein said control signal transistor means and said zero crossover detector means each is comprised of a transistor connected in common emitter configuration.

5. A solid state relay circuit comprising a pair of output terminals connectable with a load and with a source of voltage for the load, rectifier means having first and second a.c. terminals and positive and negative d.c. terminals, means for coupling said output terminals to respective rectifier a.c. terminals, gated bidirectional conduction means having first and second main terminals and at least one gate electrode, means for coupling said main terminals to respective ones of said output terminals for providing controllable bidirectional current flow therebetween, impedance means connected between one output terminal and the second one of the rectifier a.c. terminals, means for coupling the gate electrode of the bidirectional conduction device to the second one of the a.c. terminals of the rectifier means, a gated pilot conduction device having main terminals and a control electrode, means for coupling the main terminals of said pilot conduction device between the d.c. terminals of the rectifier means for providing gated unidirectional current flow therebetween, zero crossing detector means comprising a controllable conduction device having first and second main electrodes and a control electrode, means for coupling a first one of the main electrodes of the detector means to positive d.c. terminal of the rectifier means and for coupling the second main electrode of the detector means to the negative d.c. terminal of the rectifier means, means for coupling said first main electrode of the detector means to the control electrode of said pilot conduction device, said pilot conduction device being rendered conductive only when said detector means is nonconductive, a second controllable conduction device having first and second conduction terminals and a control electrode, means for coupling the first and second conduction terminals of the second controllable conduction device to the positive and negative d.c. terminals, respectively, of the rectifier means, means for coupling the control electrode of the second controllable conduction device to the first main electrode of said detector means, means for connecting the control electrode of said detector means to the first conduction terminal of said second controllable conduction device, means for coupling a control signal to said second controllable conduction device, said second controllable conduction device being capable of conducting in the presence of a control signal when the voltage between the d.c. terminals is at some value other than zero and less than a predetermined zero crossover value, and being incapable of conducting when the detector means is conducting, means for causing said detector means to conduct current only when said second controllable conduction device is nonconducting and the voltage between the d.c. terminals is greaer than said predetermined zero crossover value.

6. The solid state relay claimed in claim 5 wherein said means for coupling the first main electrode of the crossover detector means to be control electrode of the pilot conduction device is comprised of a direct connection, whereby sufficient current is supplied to the control electrode of the pilot conduction device to cause it to conduct when said detector means is nonconductive.

7. The solid state relay claimed in claim 6 wherein said means for coupling the control electrode of the second controllable conduction device to the first main electrode of the detector means includes a unidirectional conduction device operable to provide a conduction path therebetween only when the detector means is in conduction, thereby to hold the second controllable conduction device in its nonconducting state when said detector means is conducting.

8. The solid state relay claimed in claim 7 wherein said unidirectional conduction device is a diode.

9. The combination claimed in claim 8 wherein said detector means and second controllable conduction device are transistors connected in common emitter configuration.

10. A solid state relay circuit comprising
a pair of output terminals connectable with a load and with a source of voltage for the load,
a full wave rectifier having a pair of d.c. terminals and positive and negative d.c. terminals,
means including at least one resistor means for coupling said output terminals to respective rectifier a.c. terminals,
a triac having main terminals and a gate electrode,
means for coupling the main terminals of the triac to respective ones of said output terminals,
means for coupling the gate electrode of the triac of a junction between one a.c. terminal of the rectifier and said one resistor means that is coupled to an output terminal,
a SCR device having main terminals and a gate electrode,
means for coupling the main terminals of the SCR device between the rectifier d.c. terminals for permitting controlled unidirectional conduction therebetween,
zero crossover detector means comprising a transistor having collector, emitter and base electrodes connected in common emitter configuration between the rectifier d.c. terminals,
means for coupling the collector electrode of the zero crossover detector means to the gate electrode of the SCR device,
normally nonconductive second transistor means having collector, emitter and base electrodes, said collector and emitter electrodes of the second transistor means being connected between the rectifier d.c. terminals in common emitter configuration, said second transistor means being responsive to a control signal and initially being rendered conductive only when the voltage between the d.c. terminals of the rectifier is less than a predetermined zero crossover value,
means for coupling a control signal to said second transistor means,
means for coupling the base electrode of the zero crossover detector means to the collector electrode of said second transistor means,
means for coupling the base electrode of said second transistor means to the collector electrode of said zero crossover detector means,
means included within said last named means for providing unidirectional conduction from the base electrode of said second transistor means to the collector electrode of said zero crossover detector means,
the zero crossover detector means being capable of conducting current only when said second transistor means is nonconducting and the voltage between the recitifier d.c. terminals exceeds said predetermined zero crossover value.

11. The combination claimed in claim 10 wherein said second transistor means is operable in responsive to a light input signal, and wheren
said means for coupling a control signal to said second transistor means includes controllable light emitting means for emitting light on the second transistor means.

12. The combination claimed in claim 11 wherein the collector electrode of the second transistor means is coupled to the rectifier positive d.c. terminal through impedance means, and wherein the collector electrode of the detector means is coupled to the rectifier postive d.c. terminal through additional impedance means.

* * * * *

UNITED STATES PATENT AND TRADEMARK OFFICE
CERTIFICATE OF CORRECTION

PATENT NO. : 4,158,150

DATED : June 12, 1979

INVENTOR(S) : Thomas R. Dever

It is certified that error appears in the above—identified patent and that said Letters Patent is hereby corrected as shown below:

Column 6, line 7, delete "greater".

Column 6, line 12, delete "wherein".

Column 7, line 14, after "to" insert -- the --.

Column 7, line 52, "be" should read -- the --.

Column 8, line 6, "d.c." should read -- a.c. --.

Column 8, line 58, "wheren" should read -- wherein --.

Signed and Sealed this

Eleventh Day of December 1979

[SEAL]

Attest:

SIDNEY A. DIAMOND

Attesting Officer

Commissioner of Patents and Trademarks